United States Patent [19]

Norman et al.

[11] Patent Number: 5,094,701
[45] Date of Patent: Mar. 10, 1992

[54] CLEANING AGENTS COMPRISING BETA-DIKETONE AND BETA-KETOIMINE LIGANDS AND A PROCESS FOR USING THE SAME

[75] Inventors: John A. T. Norman, Whitehall; John C. Ivankovits, Northampton, both of Pa.; David A. Roberts, Carlsbad, Calif.; David A. Bohling, Emmaus, Pa.

[73] Assignee: Air Products and Chemicals, Inc., Allentown, Pa.

[21] Appl. No.: 677,915

[22] Filed: Apr. 1, 1991

Related U.S. Application Data

[63] Continuation-in-part of Ser. No. 502,209, Mar. 30, 1990, Pat. No. 5,069,725.

[51] Int. Cl.$^5$ .............................................. B23K 35/34
[52] U.S. Cl. ........................................ 148/23; 148/24; 148/25; 568/303
[58] Field of Search .................................. 148/23–25; 586/303

[56] References Cited

U.S. PATENT DOCUMENTS

| | | | |
|---|---|---|---|
| 2,801,196 | 6/1957 | Doerr | 148/23 |
| 3,301,688 | 1/1967 | Simpelaar | 106/1 |
| 4,059,218 | 11/1977 | Choby, Jr. | 228/207 |
| 4,060,191 | 11/1977 | Choby, Jr. | 228/207 |

*Primary Examiner*—Peter D. Rosenberg
*Attorney, Agent, or Firm*—Keith D. Gourley; James C. Simmons; William F. Marsh

[57] ABSTRACT

This invention is a residue-free cleaning process for removing metal-containing contaminants from a surface of a substrate of the type used in manufacturing semiconductor devices. The process comprises contacting the substrate with an effective amount of a cleaning agent comprising a $\beta$-diketone or $\beta$-ketoimine dispersed in an atmosphere capable of oxidizing the metal-contaminants at a temperature sufficient to form volatile metal-ligand complexes on the surface of the substrate. The volatile metal-ligand complexes are sublimed from the surface of the substrate leaving essentially no residue.

35 Claims, 1 Drawing Sheet

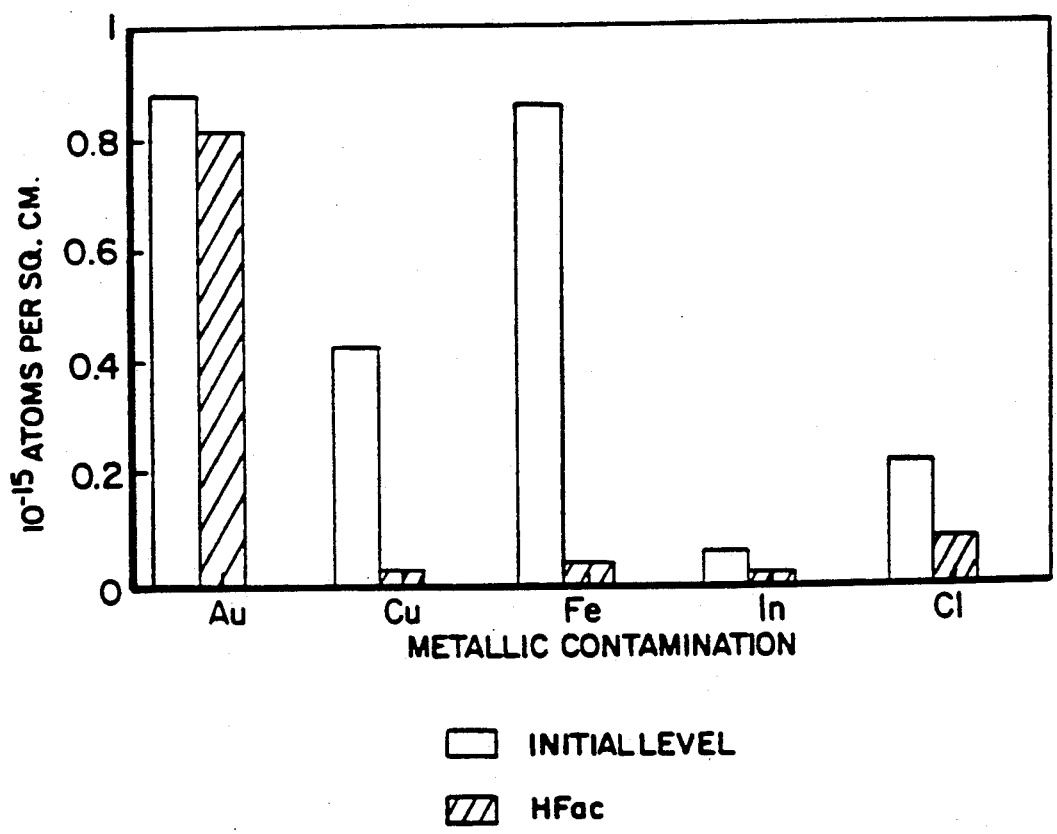

CLEANING AGENTS COMPRISING BETA-DIKETONE AND BETA-KETOIMINE LIGANDS AND A PROCESS FOR USING THE SAME

RELATED APPLICATIONS

This application is a continuation-in-part of application Ser. No. 07/502,209 U.S. Pat. No. 5,069,725, filed on Mar. 30, 1990, the subject matter of the above-mentioned application which is specifically incorporated by reference herein.

TECHNICAL FIELD

The present invention relates to cleaning agents comprising an effective amount of a β-diketone or β-ketoimine ligand dispersed in an oxidizing atmosphere and a process for cleaning metal-containing contaminants from the surface of a substrate of the type used in manufacturing semi-conductor devices.

BACKGROUND OF THE INVENTION

The electronics industry is striving to further miniaturize circuitry while increasing the complexity of the same. In order to meet this goal, the individual electrical devices such as transistors and resistors and the interconnects between such devices must be fabricated on an increasingly small scale. As device and interconnect dimensions approach one-half to one-quarter of a micron, the cleanliness of the electronic assembly impacts performance and reliability.

Typical contaminants residing on the surface of semiconductor devices include metal oxides and metal halides formed during the fabrication of the electronic device and corrosive chlorides deposited on such assemblies through various handling operations. These contaminants can weaken or embrittle the electrical connectors causing a physical failure and current leakages. Consequently, improved cleaning agents and processes for cleaning semi-conductor devices during their fabrication are required in order to more effectively remove harmful metal-containing contaminants.

BRIEF SUMMARY OF THE INVENTION

The present invention relates to cleaning agents comprising an effective amount of a β-diketone or β-ketoimine ligand dispersed in an oxidizing atmosphere and a process for cleaning metal-containing contaminants from the surface of a substrate of the type used in manufacturing semi-conductor devices.

The process for removing metal-containing contaminants from the surface of a semi-conductor substrate comprises contacting a portion of the substrate to be cleaned with an effective amount of a β-diketone or β-ketoimine cleaning agent dispersed in an atmosphere capable of oxidizing the metal-containing contaminants at a temperature sufficient to form a volatile metal-ligand complex on the surface of the substrate. The volatile metal-ligand complex is easily sublimed from the surface of the substrate leaving essentially no residue of the cleaning agent on the substrate which might later cause problems during subsequent manufacturing steps.

Cleaning agents suitable for removing metal-containing contaminants from the surface of the substrates defined herein comprise a β-diketone or β-ketoimine represented by the formula:

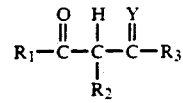

wherein:
- R₁ and R₃ are independently selected from a linear or branched non-fluorinated, partially-fluorinated or fully fluorinated alkyl, alkenyl or aryl group having from 1 to about 8 carbon atoms;
- R₂ is a hydrogen atom, a fluorine atom or a linear or branched non-fluorinated, partially-fluorinated or fully fluorinated alkyl or alkenyl group having from 1 to about 8 carbon atoms; and
- Y is selected from an oxygen atom; N—R₄ wherein R₄ is selected from a non-fluorinated, partially fluorinated, or fully fluorinated alkyl, aryl, aralkyl or hydroxyalkyl group having from 1 to about 10 carbon atoms, or Y is $$R_5-\overset{O}{\underset{}{C}}-\overset{R_6}{\underset{H}{C}}-\overset{R_7}{\underset{N}{C}}\diagdown_{R_8}\diagup_{N}$$ II wherein:
- R₅, R₆ and R₇ are independently selected from a hydrogen atom, a fluorine atom or a linear or branched non-fluorinated, partially fluorinated or fully fluorinated alkyl or alkenyl group having from 1 to about 8 carbon atoms; and
- R₈ is a linear or branched non-fluorinated, partially fluorinated or fully fluorinated alkylene, alkenylene, phenylene, alkylphenylene or hydroxyalkylene group having from 1 to about 8 carbon atoms;

wherein the ligand is dispersed in an atmosphere capable of oxidizing the metal-containing contaminants to a corresponding metal oxide compound which is capable of reacting with the selected β-diketone or β-ketoimine to form a volatile metal-ligand complex.

The above-mentioned Formula I represents three distinct types of ligands which are each suitable for practicing the cleaning process of the present invention. Each of the three types is characterized by the definition of the Y group. When Y is an oxygen atom, the ligand is a β-diketone. When Y is N—R₃, the ligand is a β-kitoimine. Finally, when Y is represented by the structure according to Formula II, the ligand comprises two β-ketoimines bridged by an organic functionality.

The invention offers numerous advantages over conventional wet-cleaning methods because the instant cleaning process can be conducted in-situ, meaning that the substrate does not have to be exposed to the clean room environment thereby avoiding recontamination via exposure to other contaminants. Moreover, the cleaning agents leave essentially no residue on the surface of the electronic assembly which might interfere with subsequent manufacturing steps.

DETAILED DESCRIPTION OF THE INVENTION

The present invention relates to cleaning agents and a process for cleaning metal-containing contaminants from the surface of a substrate of the type used in manufacturing semi-conductor devices. The invention offers numerous advantages over conventional wet-cleaning methods because the instant cleaning process can be conducted in-situ, meaning that the substrate does not have to be exposed to the clean room environment thereby avoiding recontamination via exposure to other contaminants. Moreover, the cleaning agents leave essentially no residue on the surface of the substrate which might interfere with subsequent manufacturing steps.

The cleaning process according to this invention comprises contacting a portion of the contaminated substrate with an effective amount of a $\beta$-diketone or $\beta$-ketoimine cleaning agent dispersed in an atmosphere capable of oxidizing the metal-containing contaminants at a temperature sufficient to form a volatile metal-ligand complex on the surface of the substrate. The volatile metal-ligand complex is then sublimed from the surface of the substrate. The process substantially reduces the amount of metal-containing contaminants residing on the substrate's surface which can interfere with the depositing of conducting metals, lithographic printing and other operations conducted during the process of making semi-conductor devices.

A broad range of substrates are suitable for practicing the present invention and include any substrate having metallic-containing surface contaminants wherein the substrate itself does not react with the ligands defined herein. Representative substrates include, but are not limited to silicon, silicon oxide, borophosphosilicate glass, phosphosilicate glass and strontium titanate.

The instant cleaning process which utilizes the $\beta$-diketone and $\beta$-ketoimine ligands disclosed herein can be used to remove various metal-containing contaminants including metal oxides represented by the formula MO, MO$_2$, MO$_3$, M$_2$O and M$_2$O$_3$ and metal halides represented by the formula M$^{+n}$X$^{-n}$, wherein n is 1, 2 or 3 and X is a halogen selected from Cl, Br or I.

Cleaning agents suitable for removing the above-mentioned metal-containing contaminants from the surface of the enumerated substrates comprise a $\beta$-diketone or $\beta$-ketoimine represented by the formula:

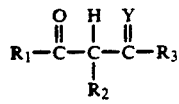

III wherein:
- R$_1$ and R$_3$ are independently selected from a linear or branched non-fluorinated, partially-fluorinated or fully fluorinated alkyl, alkenyl or aryl group having from 1 to about 8 carbon atoms;
- R$_2$ is a hydrogen atom, a fluorine atom or a linear or branched non-fluorinated, partially-fluorinated or fully fluorinated alkyl or alkenyl group having from 1 to about 8 carbon atoms; and
- Y is selected from an oxygen atom; N—R$_4$ wherein R$_4$ is selected from a non-fluorinated, partially fluorinated, or fully fluorinated alkyl, aryl, aralkyl or hydroxyalkyl group having from 1 to about 10 carbon atoms, or Y is

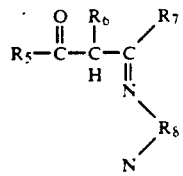

IIIa wherein:
- R$_5$, R$_6$ and R$_7$ are independently selected from a hydrogen atom, a fluorine atom or a linear or branched non-fluorinated, partially fluorinated or fully fluorinated alkyl, alkenyl or aryl group having from 1 to about 8 carbon atoms; and
- R$_8$ is a linear or branched non-fluorinated, partially fluorinated or fully fluorinated alkylene, alkenylene, phenylene, alkylphenylene or hydroxyalkylene group having from 1 to about 8 carbon atoms.

wherein the ligand is dispersed in an atmosphere capable of oxidizing the metal-containing species.

Formula III represents three distinct types of ligands which are each suitable for practicing the cleaning process of the present invention. Each of the three types is characterized by the definition of the Y group. When Y is an oxygen atom, the ligand is a $\beta$-diketone. When Y is N—R$_3$, the ligand is a $\beta$-ketoimine. Finally, when Y is represented by the structure according to Formula IIIa, the ligand comprises two $\beta$-ketoimines bridged by an organic functionality.

The non-fluorinated, partially fluorinated and fully fluorinated $\beta$-diketone ligands suitable for use in the present process are represented by the formula:

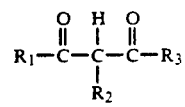

IV wherein:
- R$_1$ and R$_3$ are independently selected from a linear or branched non-fluorinated, partially-fluorinated or fully fluorinated alkyl, alkenyl or aryl group having from 1 to about 8 carbon atoms; and
- R$_2$ is a hydrogen atom, a fluorine atom or a linear or branched non-fluorinated, partially-fluorinated or fully fluorinated alkyl or alkenyl group having from 1 to about 8 carbon atoms.

In a preferred embodiment according to Formula IV, R$_2$ is a hydrogen atom or a fluorine atom and R$_1$ and R$_3$ are independently selected from a fully fluorinated linear or branched alkyl group having from 1 to about 4 carbon atoms.

The $\beta$-diketones represented by Formula IV are prepared according to methods well known in the art. In a preferred embodiment, R$_1$ and R$_3$ are independently selected from a linear or branched alkyl group having from one to about four carbon atoms, each of which can optionally be partially or fully fluorinated. Suitable alkyl groups to be fluorinated include methyl, ethyl, propyl, isopropyl, butyl, isobutyl, tert-butyl and the like.

The non-fluorinated, partially fluorinated and fully fluorinated $\beta$-ketoimine ligands of the present invention are represented by the Formula:

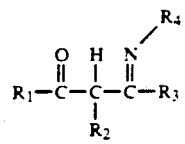

wherein:
- $R_1$ and $R_3$ are independently selected from a linear or branched non-fluorinated, partially-fluorinated or fully fluorinated alkyl, alkenyl or aryl group having from 1 to about 8 carbon atoms;
- $R_2$ is a hydrogen atom, a fluorine atom or a linear or branched non-fluorinated, partially-fluorinated or fully fluorinated alkyl or alkenyl group having from 1 to about 8 carbon atoms; and
- $R_4$ is selected from a non-fluorinated, partially fluorinated or fully fluorinated alkyl, aralkyl or hydroxyalkyl group having from 1 to about 10 carbon atoms.

A preferred method for preparing the β-ketoimine ligands disclosed in Formula V, particularly the partially or fully fluorinated β-ketoimine ligands, is disclosed in U.S. Pat. No. 4,950,790, the specification which is specifically incorporated by reference herein. In a preferred embodiment, $R_1$ and $R_3$ are independently selected from a fully fluorinated linear or branched alkyl group having from one to about four carbon atoms. Suitable alkyl groups to be fluorinated include methyl, ethyl, propyl, isopropyl, butyl, isobutyl and tert-butyl.

The β-ketoimines are prepared by treating the corresponding β-diketone with potassium hydride under conditions sufficient to produce the potassium salt of the diketone and subsequently reacting the resultant potassium salt of the diketone with a silylchloride such as tert-butyldimethylsilylchloride to produce a silylenolether having the general formula:

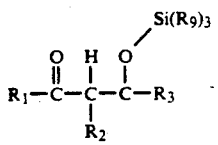

wherein:
- $R_9$ is a linear or branched alkyl group having from 1 to about 4 carbon atoms. The silylenolether described above is then treated with a primary monoamine, $R_3NH_2$, wherein $R_3$ is defined above, to produce the desired β-ketoimine.

The non-fluorinated, partially fluorinated and fully fluorinated bridged β-ketoimine ligands of the present invention are represented by the formula:

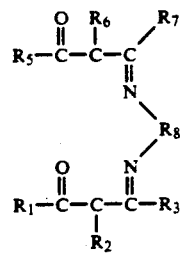

wherein:
- $R_1$ and $R_3$ are independently selected from a linear or branched non-fluorinated, partially-fluorinated or fully fluorinated alkyl, alkenyl or aryl group having from 1 to about 8 carbon atoms;
- $R_2$ is a hydrogen atom, a fluorine atom or a linear or branched non-fluorinated, partially-fluorinated or fully fluorinated alkyl or alkenyl group having from 1 to about 8 carbon atoms;
- $R_5$, $R_6$ and $R_7$ are independently selected from a hydrogen atom, a fluorine atom or a non-fluorinated, partially fluorinated or fully fluorinated alkyl or alkenyl group having from 1 to about 8 carbon atoms; and
- $R_8$ is a non-fluorinated, partially fluorinated or fully fluorinated linear or branched alkylene, alkenylene, phenylene, alkylphenylene or hydroxyalkylene group having from 1 to about 8 carbon atoms.

In a preferred embodiment, $R_1$ and $R_3$ are independently selected from a fully fluorinated linear or branched alkyl group having from one to about four carbon atoms and $R_2$ is a hydrogen atom or a fluorine atom. Suitable alkyl groups to be fluorinated include methyl, ethyl, propyl, isopropyl, butyl, isobutyl and tert-butyl.

A preferred method for preparing the bridged β-ketoimine ligands according to Formula VI is described in U.S. Pat. No. 4,950,790, the Specification which is incorporated by reference herein. These ligands are prepared by treating the corresponding β-diketone with potassium hydride under conditions sufficient to form the potassium salt of the diketone and subsequently reacting the resultant tert-butyldimethylsilylchloride to produce a silylenolether represented by formula Va.

The silylenolether is then treated with one equivalent of a primary diamine, $NH_2R_3NH_2$ wherein $R_3$ is defined above to produce the desired bridged β-ketoimine. In a preferred embodiment, $R_1$ and $R_3$ are independently selected from a linear or branched alkyl group having from one to about four carbon atoms, each of which can optionally be partially or fully fluorinated. Suitable alkyl groups include methyl, ethyl, propyl, isopropyl, butyl, isobutyl, tert-butyl and the like.

The ligands of the present invention can exist in two tautomeric forms, keto and enol, the structure of the enol form which is easily ascertained by those skilled in the art. Reference to the keto form of the above-mentioned ligands of this invention shall also expressly include the corresponding enol form.

As previously stated, the cleaning process is conducted in an atmosphere capable of oxidizing the metal-containing contaminants, which for the purpose of interpreting the specification and appended claims, refers to any atmosphere which can convert the subject metal-containing contaminants to a corresponding metal oxide which is then capable of reacting with the subject ligands to form a volatile metal-ligand complex. Suitable atmospheres include, by way of example, oxygen gas, zero-grade air (a gaseous mixture containing about 19.5 to 23.5 mol percent oxygen and less than 0.5 mol percent hydrocarbons, with the remainder comprising nitrogen, sold by Air Products and Chemicals, Inc., Allentown, PA), HCl, $Br_2$, $Cl_2$, HF and the like. Moreover such oxidizing atmospheres may be dispersed in carrier gases such as argon, nitrogen, helium and perfluorinated hydrocarbons such as Multifluor® APF-200 perfluoroisopropyldecalin, which is commercially available from Air Products and Chemicals, Inc., Allentown, Pa.

The cleaning agents according to the present invention can be applied by both machine and manual operations known in the art. The particular cleaning agent to be utilized and the appropriate oxidizing atmosphere for delivering the cleaning agents to the substrates to be cleaned will depend upon numerous factors including the properties of the semi-conductor device, the type of metal-containing contaminants to be removed from the substrate's surface and the like.

In order to more fully describe the practice of the present process, a general embodiment of the instant process for cleaning the previously defined substrates will be discussed. The substrate is placed into an infrared furnace, vapor phase machine or other suitable furnace typically used in cleaning processes known in the art and heated to the desired temperature, typically from about 200° to 300° C. The desired β-diketone or β-ketoimine dispersed in the desired oxidizing atmosphere (for example, zero-grade air) are passed into the hot zone of the selected furnace by conventional techniques.

The ligand-saturated oxidizing atmospheric stream may be continuously or intermittently delivered into the furnace. The process can be conducted in one or two stages. For example the metal-containing contaminants may be initially oxidized by subjecting the substrate to the defined oxidizing atmosphere followed by treating the substrate with the desired cleaning agent at a later time. Alternately, the process may be conducted in one stage wherein the metal oxides are formed in-situ followed by the immediate reaction of the ligands according to the present invention with metal oxides and metal halides residing on the substrate's surface to form volatile metal-ligand complexes which are then conveniently sublimed from the surface to provide a substrate which is substantially residue free.

The β-diketone ligands have been experimentally shown to react with commonly occurring oxides (CuO, Cu$_2$O, PbO, SnO and the like) typically residing on the surface of the defined substrates. The resultant reaction products have been analytically identified as Cu(HFac)$_2$, Pb(HFac)$_2$ and Sn(HFac)$_2$, respectively. Such products are sufficiently volatile such that following sublimation, essentially no residue remains on the substrate.

The desired cleaning agent should contain an amount of ligand dispersed in an oxidizing atmosphere such that maximum cleaning activity is obtained. The term, effective amount, refers to that amount of ligand which provides a sufficient amount of cleaning to satisfy the desired application. The optimum concentration will vary depending upon the particular cleaning ligand used and the metal-containing compounds to be cleaned from the surface of the substrate. Typical concentrations range from 1.0% to about 40.0%, and preferably, from 5.0% to 25.0% of the desired ligand dispersed in an oxidizing atmosphere. If the ligand concentration in the oxidizing atmosphere is less than about 4.6%, a decreased cleaning action may occur.

The process can be practiced at temperatures comensurate with those used in conventional cleaning processes. Typical temperatures for practicing the process range from about 200° to 230° C. The optimum reaction time and temperature for practicing the process will vary depending upon the particular ligand used, the type and quantity of contaminants to be removed and the like. Typical processing time ranges from about 5 to 50 minutes. Shorter process times (i.e., <5 minutes) have been found to decrease cleaning effectiveness. Furnace pressure typically ranges from about 0 to 1.5 psig although the pressure is not critical to the practice of the invention.

The following example is provided to further illustrate an embodiment of the present invention and is not intended to restrict the scope of the invention. In the following example, temperatures are set forth uncorrected in degrees Celsius.

EXAMPLE

Cleaning Of A Silicon Wafer With Hexafluoroacetylacetone

A silicon wafer was analyzed by X-Ray fluorescence and Rutherford Back-Scattering to determine the amount of gold-, copper-, iron-, indium-and chloride-containing contaminants residing on the substrate's surface. The wafer was placed at a 30 degree angle in a pyrex ® wafer boat. Filtered zero-grade oxygen was bubbled through unpurified 1,1,1,5,5,5-hexafluoro-2,4-pentanedione, having the common name, hexafluoroacetylacetone, referred to herein as HFac (Strem Chemicals, Inc. Newburtport) at a rate of 83 sccm or 16.5% HFac in the process stream. The silicon wafer was contacted with HFac and heated to 205° C. for 40 minutes. The results presented in the sole Table demonstrate that the cleaning process is extremely effective in removing copper-, iron-, chloride- and indium-containing contaminants from the substrate's surface. The process demonstrates marginal success in removing gold-containing contaminants from the surface.

Representative ligands suitable for use in the present invention are disclosed below wherein the chemical structure and both the IUPAC and abbreviated names of the ligands are provided.

4-(2,2,2-trifluoroethyl)-imino-1,1,1,5,5,5-hexafluoro-2-pentanone
(H)NONA-F[TFEA]

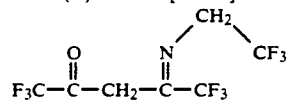

5-(2,2,2-trifluoroethyl)imino-1,1,1,2,2,6,6,6-octafluoro-3-hexanone
(H)UNDECA-F[TFEA]

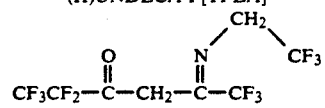

6-(2,2,2-trifluoroethyl)imino-1,1,1,2,2,3,3,7,7,7-decafluoro
-4-heptanone(H)TRIDECA-F[TFEA]

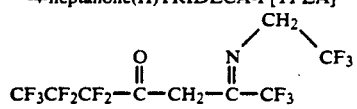

4-(phenyl)imino-1,1,1,5,5,5-hexafluoro-2-pentanone
(H)HEXA-F[AN]

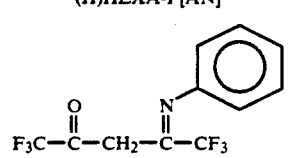

4-(2-hydroxyethyl)imino-1,1,1,5,5,5-hexafluoro-2-pentanone
(H)HEXA-F[EOA]

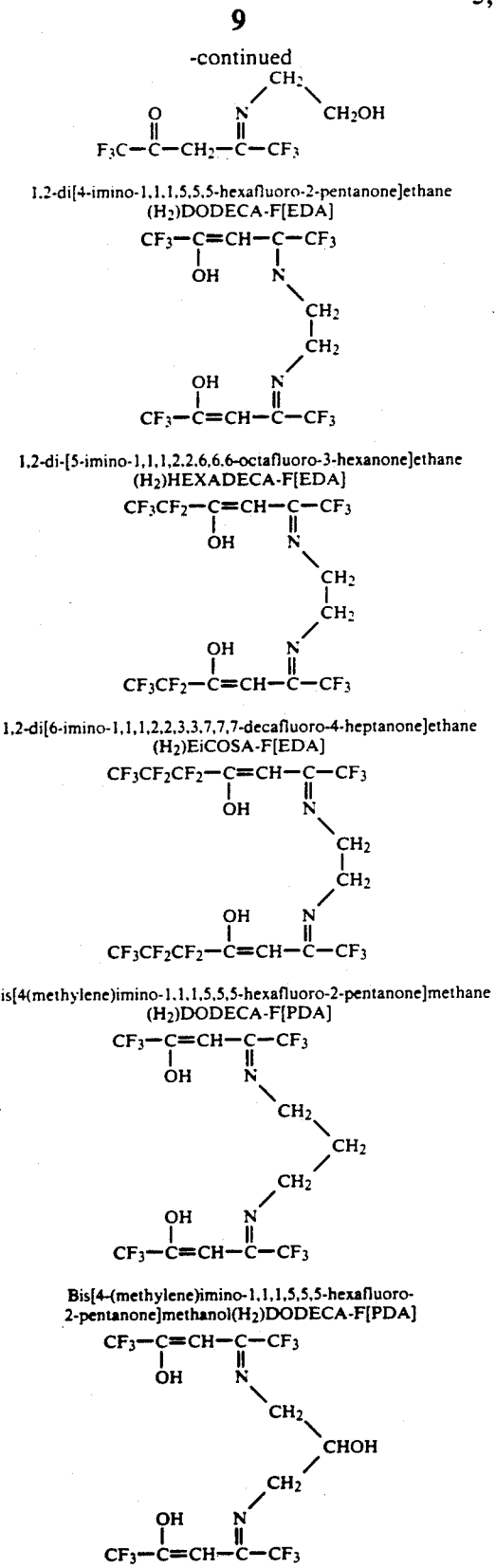

The present vapor-phase process for cleaning metal-containing contaminants from the surface of substrates of the type used in manufacturing semi-conductor devices offers numerous advantages over typical wet cleaning methods known in the art because the instant cleaning process can be conducted in-situ, meaning that the substrate does not have to be exposed to the clean room environment thereby avoiding recontamination via exposure to other contaminants. Moreover, the cleaning agents leave essentially no residue on the surface of the electronic assembly which might later interfere with subsequent manufacturing steps.

Having thus described the present invention, what is now deemed appropriate for Letters Patent is set out in the following appended claims.

We claim:

1. A cleaning agent for removing metal-containing contaminants from a surface of a substrate, the cleaning agent comprising a $\beta$-diketone or $\beta$-ketoimine ligand which is dispersed in an atmosphere capable of oxidizing the metal-containing contaminants residing on the surface of the substrate, the $\beta$-diketone or $\beta$-ketoimine ligand which is represented by the formula:

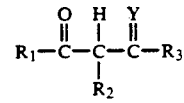

wherein:
R$_1$ and R$_3$ are independently selected from a linear or branched non-fluorinated, partially-fluorinated or fully fluorinated alkyl, alkenyl or aryl group having from 1 to about 8 carbon atoms;

R$_2$ is a hydrogen atom, a fluorine atom or a linear or branched non-fluorinated, partially-fluorinated or fully fluorinated alkyl or alkenyl group having from 1 to about 8 carbon atoms; and Y is selected from an oxygen atom; N—R$_4$ wherein R$_4$ is selected from a non-fluorinated, partially fluorinated, or fully fluorinated alkyl, aryl, aralkyl or hydroxyalkyl group having from 1 to about 10 carbon atoms, or Y is

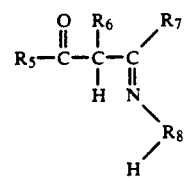

wherein:
R$_5$, R$_6$ and R$_7$ are independently selected from a hydrogen atom, a fluorine atom or a linear or branched non-fluorinated, partially fluorinated or fully fluorinated alkyl or alkenyl group having from 1 to about 8 carbon atoms; and R$_8$ is a linear or branched non-fluorinated, partially fluorinated or fully fluorinated alkylene, alkenylene, phenylene, alkylphenylene or hydroxyalkylene group having from 1 to about 8 carbon atoms; with the proviso that the ligand is not capable of reacting with the substrate.

2. The cleaning agent according to claim 1 wherein the oxidizing atmosphere is selected from oxygen, air, HCl, Br$_2$, Cl$_2$ or HF.

3. A cleaning agent for removing metal-containing contaminants from a surface of a substrate, the cleaning agent comprising a $\beta$-diketone ligand which is dispersed in an atmosphere capable of oxidizing the metal-containing contaminants residing on the surface of the substrate, the β-diketone which is represented by the formula:

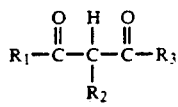

R$_1$ and R$_3$ are independently selected from a linear or branched non-fluorinated, partially-fluorinated or fully fluorinated alkyl, alkenyl or aryl group having from 1 to about 8 carbon atoms; and R$_2$ is a hydrogen atom, a fluorine atom or a linear or branched non-fluorinated, partially-fluorinated or fully fluorinated alkyl or alkenyl group having from 1 to about 8 carbon atoms;

with the proviso that the ligand is not capable of reacting with the substrate.

4. The cleaning agent according to claim 3 wherein the oxidizing atmosphere is selected from oxygen, air, HCl, Br$_2$, Cl$_2$ or HF.

5. The cleaning agent according to claim 4 wherein R$_1$ and R$_3$ are independently selected from a fully fluorinated linear or branched alkyl group having from 1 to about 4 carbon atoms and R$_2$ is a hydrogen atom or a fluorine atom.

6. The cleaning agent according to claim 4 wherein the ligand is selected from 1,1,1,5,5,5-hexafluoro-2,4-pentanedione, 1,1,1-trifluoro-2,4-pentanedione, 2,2,6,6-tetramethyl-3,5-heptanedione and 1,1,1,5,5,6,6,7,7,7-decafluoro-2,4-heptanedione.

7. The cleaning agent according to claim 4 wherein the ligand is 1,1,1,5,5,5-hexafluoro-2,4-pentanedione.

8. A cleaning agent for removing metal-containing contaminants from a surface of a substrate, the cleaning agent comprising a β-ketoimine ligand which is dispersed in an atmosphere capable of oxidizing the metal-containing contaminants residing on the surface of the substrate, the β-ketoimine ligand which is represented by the formula:

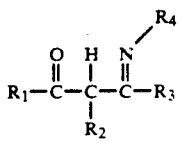

wherein:

R$_1$ and R$_3$ are independently selected from a linear or branched non-fluorinated, partially-fluorinated or fully fluorinated alkyl, alkenyl or aryl group having from 1 to about 8 carbon atoms;

R$_2$ is a hydrogen atom, a fluorine atom or a linear or branched non-fluorinated, partially-fluorinated or fully fluorinated alkyl or alkenyl group having from 1 to about 8 carbon atoms; and R$_4$ is selected from a non-fluorinated, partially fluorinated or fully fluorinated alkyl, aralkyl or hydroxyalkyl group having from 1 to about 10 carbon atoms;

with the proviso that the ligand is not capable of reacting with the substrate.

9. The cleaning agent according to claim 8 wherein the oxidizing atmosphere is selected from oxygen, air, HCl, Br$_2$, Cl$_2$ or HF.

10. The cleaning agent according to claim 9 wherein R$_1$ and R$_3$ are independently selected from a fully fluorinated linear or branched alkyl group having from 1 to about 4 carbon atoms and R$_2$ is a hydrogen atom or a fluorine atom.

11. The cleaning agent according to claim 9 wherein the ligand is selected from 4-(2,2,2-trifluoroethyl)imino-1,1,1,5,5,5-hexafluoro-2-pentanone, 5-(2,2,2-trifluoroethyl)imino-1,1,1,2,2,6,6,6-octafluoro-3-hexanone, 6-(2,2,2-trifluoroethyl)imino-1,1,1,2,2,3,3,7,7,7-decafluoro-4-heptanone and 4-(phenyl)imino-1,1,1,5,5,5-hexafluoro-2-pentanone.

12. A cleaning agent for removing metal-containing contaminants from a surface of a substrate, the cleaning agent comprising a β-ketoimine ligand which is dispersed in an atmosphere capable of oxidizing the metal-containing contaminants residing on the surface of the substrate, the β-ketoimine ligand which is represented by the formula:

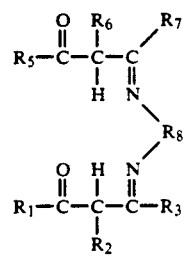

wherein:

R$_1$ and R$_3$ are independently selected from a linear or branched non-fluorinated, partially-fluorinated or fully fluorinated alkyl, alkenyl or aryl group having from 1 to about 8 carbon atoms;

R$_2$ is a hydrogen atom, a fluorine atom or a linear or branched non-fluorinated, partially-fluorinated or fully fluorinated alkyl or alkenyl group having from 1 to about 8 carbon atoms;

R$_5$, R$_6$ and R$_7$ are independently selected from a hydrogen atom, a fluorine atom or a partially fluorinated or fully fluorinated alkyl or alkenyl group having from 1 to about 8 carbon atoms; and R$_8$ is a non-fluorinated, partially fluorinated or fully fluorinated linear or branched alkylene, alkenylene, phenylene, alkylphenylene or hydroxyalkylene group having from 1 to about 8 carbon atoms;

with the proviso that the ligand is not capable of reacting with the substrate.

13. The cleaning agent according to claim 12 wherein the oxidizing atmosphere is selected from oxygen, air, HCl, Br$_2$, Cl$_2$ or HF.

14. The cleaning agent according to claim 13 wherein R$_1$ and R$_3$ are independently selected from a fully fluorinated linear or branched alkyl group having from 1 to about 4 carbon atoms and R$_2$ is a hydrogen atom or a fluorine atom.

15. The cleaning agent according to claim 12 wherein the ligand is selected from 1,2-di[4-imino-1,1,1,5,5,5-hexafluoro-2-pentanone]ethane, 1,2-di[5-imino-1,1,1,2,2,6,6,6-octafluoro-3-hexanone]ethane, 1,2-di[6-imino-1,1,1,2,2,3,3,7,7,7-decafluoro-4-heptanone]ethane and Bis[4-methylene)imino-1,1,1,5,5,5-hexafluoro-2-pentanone]methane.

16. A process for cleaning metal-containing contaminants from a surface of a substrate of the type used in manufacturing semi-conductor devices comprising contacting a portion of the substrate to be cleaned with an effective amount of the cleaning agent according to claim 2 at a temperature sufficient to form a volatile metal-ligand complex on the surface of the substrate and subliming the metal-ligand complex from the surface of the substrate.

17. The process according to claim 16 wherein the substrate is selected from silicon, silicon oxide, borophosphosilicate glass, phosphosilicate glass and strontium titanate.

18. The process according to claim 17 wherein the metal-containing contaminants comprise at least one metal oxide represented by the formulae MO, $MO_2$, $MO_3$, $M_2O$ and $M_2O_3$.

19. The process according to claim 17 wherein the metal-containing contaminants comprise at least one metal halide represented by the formula $M^{+n}(X)^{-n}$, wherein n is 1, 2 or 3 and X is a chlorine, bromine or iodine atom.

20. A process for cleaning metal-containing contaminants from a surface of a substrate of the type used in manufacturing semi-conductor devices comprising contacting a portion of the substrate to be cleaned with an effective amount of the cleaning agent according to claim 4 at a temperature sufficient to form a volatile metal-ligand complex on the surface of the substrate and subliming the metal-ligand complex from the surface of the substrate.

21. The process according to claim 20 wherein the substrate is selected from silicon, silicon oxide, borophosphosilicate glass, phosphosilicate glass and strontium titanate.

22. The process according to claim 21 wherein the metal-containing contaminants comprise at least one metal oxide represented by the formulae MO, $MO_2$, $MO_3$, $M_2O$ and $M_2O_3$.

23. The process according to claim 21 wherein the metal-containing contaminant comprises at least one metal halide represented by the formula $M^{+n}(X)^{-n}$, wherein n is 1, 2 or 3 and X is a chlorine, bromine or iodine atom.

24. The process according to claim 20 wherein the ligand is selected from 1,1,1,5,5,5-hexafluoro-2,4-pentanedione, 1,1,1-trifluoro-2,4-pentanedione, 2,2,6,6-tetramethyl-3,5-heptanedione and 1,1,1,5,5,6,6,7,7,7-decafluoro-2,4-heptanedione.

25. The process according to claim 21 wherein the ligand is 1,1,1,5,5,5-hexafluoro-2,4-pentanedione.

26. A process for cleaning metal-containing contaminants from a surface of a substrate of the type used in manufacturing semi-conductor devices comprising contacting a portion of the substrate to be cleaned with an effective amount of a cleaning agent according to claim 9 at a temperature sufficient to form a volatile metal-ligand complex on the surface of the substrate and subliming the metal-ligand complex from the surface of the substrate.

27. The process according to claim 26 wherein the substrate is selected from silicon, silicon oxide, borophosphosilicate glass, phosphosilicate glass and strontium titanate.

28. The process according to claim 26 wherein the metal-containing contaminants comprise at least one metal oxide represented by the formulae MO, $MO_2$, $MO_3$, $M_2O$ and $M_2O_3$.

29. The process according to claim 26 wherein the metal-containing contaminants comprises at least one metal halide represented by the formula $M^{+n}(X)^{-n}$, wherein n is 1, 2 or 3 and X is a chlorine, bromine or iodine atom.

30. The process according to claim 26 wherein the ligand is selected from 4-(2,2,2-trifluoroethyl)imino-1,1,1,5,5,5-hexafluoro-2-pentanone, 5-(2,2,2-trifluoroethyl)imino-1,1,1,2,2,6,6,6-octafluoro-3-hexanone, 6-(2,2,2-trifluoroethyl)imino-1,1,1,2,2,3,3,7,7,7,-decafluoro-4-heptanone and 4-(phenyl)imino-1,1,1,5,5,5-hexafluoro-2-pentanone.

31. A process for cleaning metal-containing contaminants from a surface of a substrate of the type used in manufacturing semi-conductor devices comprising contacting a portion of the substrate to be cleaned with an effective amount of the cleaning agent according to claim 13 at a temperature sufficient to form a volatile metal-ligand complex on the surface of the substrate and subliming the metal-ligand complex from the surface of the substrate.

32. The process according to claim 31 wherein the substrate is selected from silicon, silicon oxide, borophosphosilicate glass, phosphosilicate glass and strontium titanate.

33. The process according to claim 31 wherein the metal-containing contaminants comprise at least one metal oxide represented by the formulae MO, $MO_2$, $MO_3$, $M_2O$ and $M_2O_3$.

34. The process according to claim 31 wherein the metal-containing species comprises at least one metal halide represented by the formula $M^{+n}(X)^{-n}$, wherein n is 1, 2 or 3 and X is a chlorine, bromine or iodine atom.

35. The process according to claim 31 wherein the ligand is selected from 1,2-di[4-imino-1,1,1,5,5,5-hexafluoro-2-pentanone]ethane, 1,2-di[5-imino-1,1,1,2,2,6,6,6-octafluoro-3-hexanone]ethane, 1,2-di-[6-imino-1,1,1,2,2,3,3,7,7,7-decafluoro-4-heptanone]ethane and Bis[4-methylene)imino-1,1,1,5,5,5-hexafluoro-2-pentanone]methane.

* * * * *